(12) United States Patent
Ogawa et al.

(10) Patent No.: US 8,841,976 B2
(45) Date of Patent: Sep. 23, 2014

(54) PRINTED WIRING BOARD INCLUDING FIRST AND SECOND INSULATING LAYERS HAVING DIELECTRIC LOSS TANGENTS THAT ARE DIFFERENT BY A PREDETERMINED RELATIONSHIP

(75) Inventors: Taiji Ogawa, Sakura (JP); Hirohito Watanabe, Sakura (JP); Masazaku Sato, Sakura (JP)

(73) Assignee: Fujikura Ltd., Tokyo (JP)

( * ) Notice: Subject to any disclaimer, the term of this patent is extended or adjusted under 35 U.S.C. 154(b) by 326 days.

(21) Appl. No.: 13/345,974

(22) Filed: Jan. 9, 2012

(65) Prior Publication Data

US 2012/0205141 A1 Aug. 16, 2012

(30) Foreign Application Priority Data

Feb. 10, 2011 (JP) ................... 2011-027624

(51) Int. Cl.
*H01P 3/08* (2006.01)
*H05K 1/02* (2006.01)

(52) U.S. Cl.
CPC .............. *H05K 1/024* (2013.01); *H01P 3/081* (2013.01); *H05K 1/0225* (2013.01); *H05K 1/0245* (2013.01); *H05K 1/0253* (2013.01); *H05K 2201/09681* (2013.01); *H05K 2201/09236* (2013.01)
USPC ............................................. 333/1; 333/238

(58) Field of Classification Search
CPC ........... H01P 3/08; H01P 3/081; H01P 3/082; H05K 1/0237
USPC ................................................... 333/1, 238
See application file for complete search history.

(56) References Cited

U.S. PATENT DOCUMENTS

| 5,982,249 | A * | 11/1999 | Bruns ................... 333/1 |
| 6,479,136 | B1 | 11/2002 | Nakanishi |
| 6,674,347 | B1 * | 1/2004 | Maruhashi et al. ........... 333/238 |
| 8,215,848 | B1 | 7/2012 | Chan et al. |
| 2006/0028305 | A1 | 2/2006 | Dutta et al. |
| 2009/0056983 | A1 * | 3/2009 | Liu et al. ................ 174/255 |

FOREIGN PATENT DOCUMENTS

| CN | 1321407 A | 11/2001 |
| JP | 11-168279 A | 6/1999 |
| JP | 2003218535 A | 7/2003 |
| JP | 2007208473 A | 8/2007 |
| JP | 2010114189 A | 5/2010 |

OTHER PUBLICATIONS

Chinese Office Action corresponding to Chinese Patent Application No. 201210027061.8, dated Feb. 8, 2014.

* cited by examiner

*Primary Examiner* — Benny Lee
(74) *Attorney, Agent, or Firm* — Sughrue Mion, PLLC

(57) ABSTRACT

The printed wiring board has a conductor of signal line 41 and two conductive lines 42 on one face of the first insulating layer 10 covered by a second insulating layer 20, while having a ground layer of the ground 30 potential on the opposite face thereof, when the dielectric tangent A of the second insulating layer (insulating layer A) 20 is larger than the dielectric tangent B of the first insulating layer (insulating layer B) 10, Relational Expression 1: (relative permittivity B)·(width (W41) of signal line(s) 41)/(thickness (T10) of first insulating layer (insulating layer B) 10)>(relative permittivity A)·{(thickness (T41) of signal line(s) 41)/(distance (S1) between signal line(s) 41 and one conductive line 42a)+(thickness (T41) of signal line(s) 41)/(distance (S2) between signal line(s) 41 and other conductive line 42b)+(thickness (T41) of signal lines 41)/(distance (S3) between pair of signal lines (41a and 41b)·2} is satisfied.

8 Claims, 9 Drawing Sheets

PRINTED WIRING BOARD INCLUDING FIRST AND SECOND INSULATING LAYERS HAVING DIELECTRIC LOSS TANGENTS THAT ARE DIFFERENT BY A PREDETERMINED RELATIONSHIP

BACKGROUND OF THE INVENTION

1. Technical Field of the Invention

The present invention relates to a printed wiring board having one or more signal lines.

The present application claims priority from Japanese Patent Application No. 2011-027624, filed on Feb. 10, 2011, which is incorporated by reference in its entity and which is to be a part of the description and/or drawings of the present application.

2. Description of the Related Art

Signal lines of a printed wiring board are covered by an insulating layer in general, and it is known that the dielectric tangent of this insulating layer affects the signal loss. Multi-layer circuit boards are known which relate to this kind of technique and in which signal lines are surrounded by an air layer in view of achieving high-speed transmission (Japanese unexamined Patent Publication No. H11 (1999)-168279 (Patent Document 1)).

PRIOR ART DOCUMENT(S)

Patent Document(s)

[Patent Document 1] Japanese unexamined Patent Publication No. H11 (1999)-168279

SUMMARY OF THE INVENTION

Problems to be Solved by the Invention

However, if the structure of a printed wiring board for high-speed transmission is modified according to the above prior art document, problems possibly occur that designing such a structure may be difficult because restrictions with regard to the material and structure are imposed and a new processing method must be developed.

Problems to be solved by the present invention include providing a structure of printed wiring board which is capable of achieving high-speed transmission while being readily to be designed.

Means for Solving the Problems (1) The present invention solves the above problems by providing a printed wiring board comprising: a first insulating layer; a ground layer formed on one main surface of the first insulating layer; a signal line formed on other main surface of the first insulating layer; two conductive lines formed on the other main surface of the first insulating layer and juxtaposed to the signal line such that the signal line is interposed between the conductive lines; and a second insulating layer laminated at a side of the other main surface of the first insulating layer so as to cover the signal line and the conductive lines, wherein, upon a dielectric tangent of the second insulating layer being larger than a dielectric tangent of the first insulating layer, the printed wiring board is configured to have a relationship as follows: (a relative permittivity of the first insulating layer)·(a width of the signal line)/(a thickness of the first insulating layer)>(a relative permittivity of the second insulating layer)·((a thickness of the signal line)/(a distance between the signal line and one of the conductive lines)+(the thickness of the signal line)/(a distance between the signal line and the other of the conductive lines)).

(2) In the present invention, the above problems are solved by providing a printed wiring board comprising: a first insulating layer; a ground layer formed on one main surface of the first insulating layer; a signal line formed on other main surface of the first insulating layer; two conductive lines formed on the other main surface of the first insulating layer and juxtaposed to the signal line such that the signal line is interposed between the conductive lines; and a second insulating layer laminated at a side of the other main surface of the first insulating layer so as to cover the signal line and the conductive lines, wherein, upon a dielectric tangent of the second insulating layer being smaller than a dielectric tangent of the first insulating layer, the printed wiring board is configured to have a relationship as follows: (a relative permittivity of the first insulating layer)·(a width of the signal line)/(a thickness of the first insulating layer)<(a relative permittivity of the second insulating layer)·((a thickness of the signal line)/(a distance between the signal line and one of the conductive lines)+(the thickness of the signal line)/(a distance between the signal line and the other of the conductive lines)).

(3) In the above invention, the above problems are solved by providing a printed wiring board comprising: a first insulating layer; a ground layer formed on one main surface of the first insulating layer; a pair of signal lines formed on other main surface of the first insulating layer; two conductive lines formed on the other main surface of the first insulating layer and juxtaposed to the pair of signal lines such that the signal lines are interposed between the conductive lines; and a second insulating layer laminated at a side of the other main surface of the first insulating layer so as to cover the signal lines and the conductive lines, wherein, upon a dielectric tangent of the second insulating layer being larger than a dielectric tangent of the first insulating layer, the printed wiring board is configured to have a relationship as follows: (a relative permittivity of the first insulating layer)·(a width of the signal lines)/(a thickness of the first insulating layer)>(a relative permittivity of the second insulating layer)·((a thickness of the signal lines)/(a distance between the signal lines and one of the conductive lines)+(the thickness of the signal lines)/(a distance between the signal lines and the other of the conductive lines)+(the thickness of the signal lines)/(a distance between the pair of signal lines)·2), or wherein, upon a dielectric tangent of the second insulating layer being smaller than a dielectric tangent of the first insulating layer, the printed wiring board is configured to have a relationship as follows: (a relative permittivity of the first insulating layer)·(a width of the signal lines)/(a thickness of the first insulating layer)<(a relative permittivity of the second insulating layer)·((a thickness of the signal lines)/(a distance between the signal lines and one of the conductive lines)+(the thickness of the signal lines)/(a distance between the signal lines and the other of the conductive lines)+(the thickness of the signal lines)/(a distance between the pair of signal lines)·2).

(4) In the above invention, the ground layer has a mesh structure configured such that a plurality of regions are discretely removed to leave a remaining region, and a value of (a relative permittivity of the first insulating layer)·(a width of the signal line)/(a thickness of the first insulating layer) in the relationship may be multiplied by a conductive region ratio representing a ratio of an area of the remaining region to an area of an entire region where the ground layer is provided, thereby being calculated as (a relative permittivity of the first insulating layer)·(a width of the signal line)/(a thickness of the first insulating layer)·(the conductive region ratio).

Advantageous Effect of the Invention

According to the present invention, the electrostatic capacitance in each insulating layer of the printed wiring board is allowed to be adjusted on the basis of the relationship among the material characteristics of the insulating layers, the width of the signal line(s) and the thicknesses of the insulating layers, depending on the magnitude of the relationship in the dielectric tangent between the insulating layers that contacts the signal line(s). Consequently, the printed wiring board can be provided to have a structure capable of high-speed transmission while being readily to be designed.

DETAILED DESCRIPTION OF THE PREFERRED EMBODIMENT

First Embodiment

Hereinafter, a first embodiment according to the present invention will be described with reference to the drawings. In the present embodiment, examples will be described in which a printed wiring board 1 according to the present invention is applied to one or more transmission lines for connecting between circuits in a device or between devices.

Figure 1:
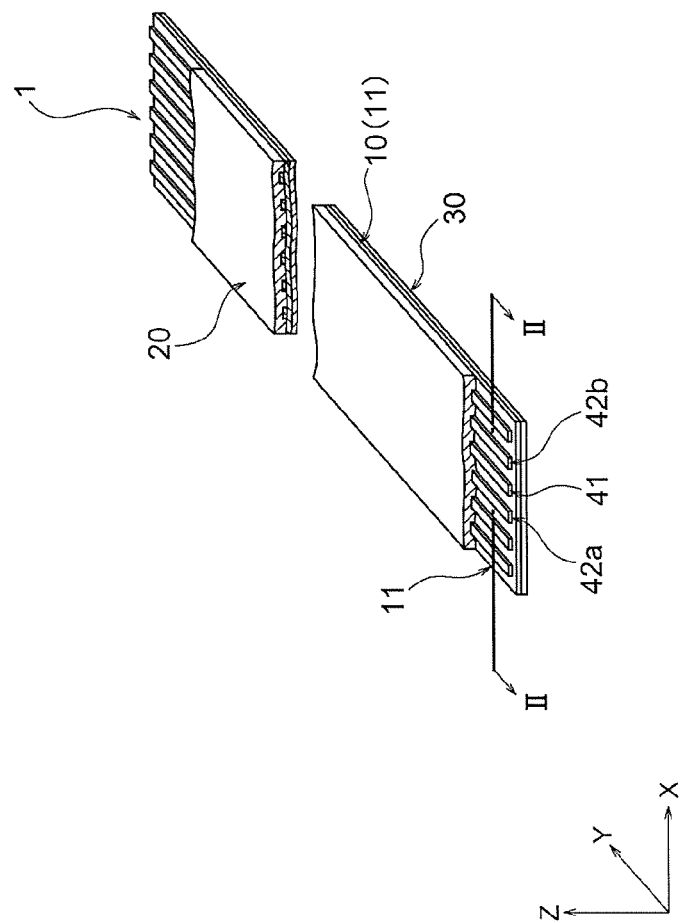
FIG. 1 is a perspective view of a printed wiring board according to embodiments of the present invention.

FIG. 1 is a perspective view illustrating a status where parts of a protecting layer 20 are stripped from the printed wiring board 1 according to the present embodiment.

As shown in FIG. 1, a signal line 41 is provided to extend along Y-direction in the figure on a main surface (the surface at the side of positive Z-direction in the figure) of an insulating base material 11, and two conductive lines 42a and 42b are juxtaposed at both right and left sides of the signal line 41 such that the signal line 41 is interposed between the conductive lines 42a and 42b with certain constant spaces in X-direction, which is perpendicular to the Y-direction and the Z-direction, and is referred to as width direction of each component. The conductive lines 42a and 42b may be ones having transmission function or ones functioning as ground for signals. The protecting layer 20 covers these signal line 41 and conductive lines 42a and 42b. In addition, the opposite main surface of the insulating base material 11 is formed thereon with a ground layer 30, such as copper foil. Thus, the printed wiring board 1 according to the present embodiment comprises a so-called microstrip line structure which has a conductor of signal line on one face of an insulating layer while having a ground layer of the ground potential on the opposite face thereof.

A method of producing the printed wiring board 1 according to the present embodiment will be briefly described with reference to FIG. 1 together with FIG. 2. First, a double-face conductor-foil-laminated board is prepared. This conductive-foil-laminated board is a plate-like member in which metal foils, such as copper foils, are applied to both main surfaces of an insulating base material 11, such as polyimide (PI), via a first adhesive layer 12 and a second adhesive layer 13. As the insulating base material 11, polyethylene terephthalate (PET), polyethylene naphthalate (PEN), polyester (PE), liquid crystal polymer (LCP), etc. may be used. The metal foil formed on one main surface of the printed wiring board 1 is caused to function as the ground layer 30, while certain regions of the metal foil are removed from the other main surface using common photolithography method thereby to form the signal line 41 and the conductive lines 42a and 42b. Thereafter, a sheet-like protecting layer 20 is laminated to cover the signal line 41 and the conductive lines 42a and 42b, followed by a heat treatment, and the printed wiring board 1 according to the present embodiment is thus obtained.

Hereinafter, the structure of the printed wiring board 1 according to the present embodiment will be described in detail.

Figure 2:
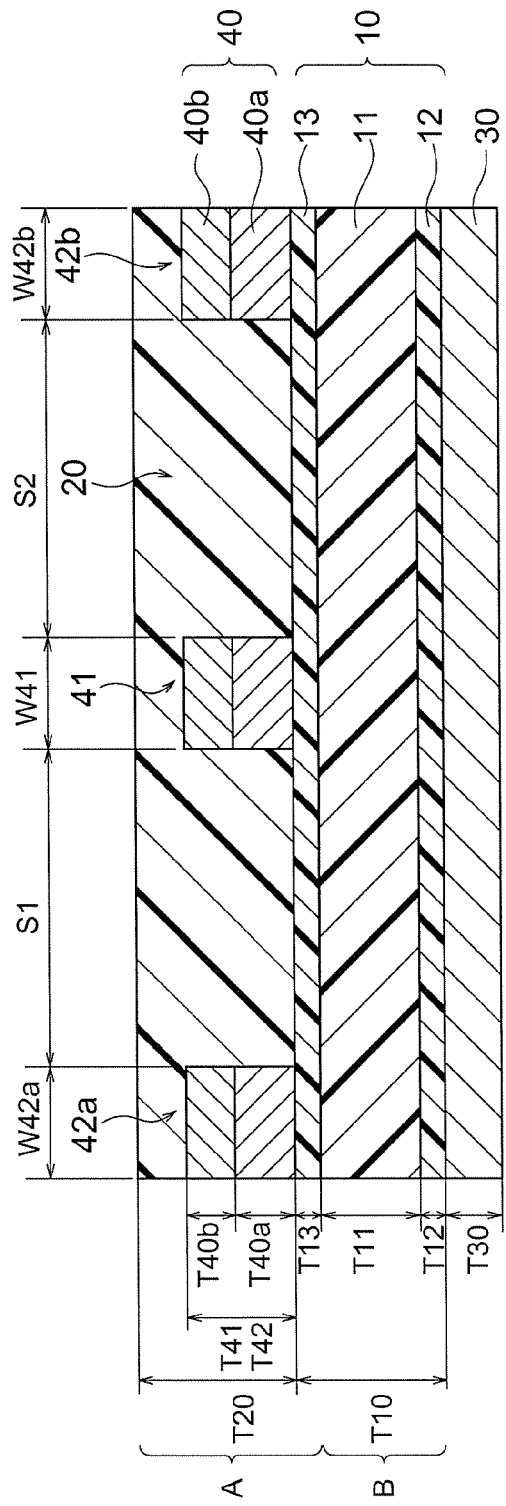
FIG. 2 is an enlarged cross-sectional view along line II-II in FIG. 1.

FIG. 2 is an enlarged cross-sectional view along line II-II in FIG. 1. As shown in FIG. 2, the ground layer 30 is formed with a predetermined thickness (T30) on one main surface (lower surface) of a first insulating layer 10 (thickness T10) including the insulating base material 11 of thickness T11, the first adhesive layer 12 of thickness T12, and the second adhesive layer 13 of thickness T13.

Moreover, the other main surface (upper surface) of the first insulating layer 10 is formed thereon with lines 40 that comprise the signal line 41 of thickness T41 and the conductive lines 42a and 42b of thickness T42, each including a copper foil layer 40a of thickness T40a and a plated layer 40b of thickness T40b. The line width of the signal line 41 is W41, and the line widths of the conductive lines 42a and 42b are W42a and W42b, respectively. Furthermore, the spaces between the signal line 41 and the conductive lines 42a and 42b juxtaposed at both sides thereof are constant as being S1 and S2, respectively.

The protecting layer 20 is formed with a thickness T20 to cover the signal line 41 and the conductive lines 42a and 42b.

The printed wiring board 1 according to the present embodiment has a configuration depending on the magnitude relationship between the dielectric tangent of a second insulating layer 20 (hereinafter also referred to as insulating layer A), which includes the protecting layer 20 and the required adhesive layer (not shown in the FIG. 2), and the dielectric tangent of the first insulating layer 10 (hereinafter also referred to as insulating layer B), which includes the insulating base material 11 and the required adhesive layers (12 and 13).

Specifically, the printed wiring board 1 according to the present invention has a configuration which satisfies the following Relational Expression 1 when the dielectric tangent of the second insulating layer (insulating layer A) 20 (hereinafter also referred to as dielectric tangent A) is larger than the dielectric tangent of the first insulating layer (insulating layer B) 10 (hereinafter also referred to as dielectric tangent B).

(relative permittivity of first insulating layer (insulating layer B)10)·(width (W41) of signal line 41)/(thickness (T10) of first insulating layer (insulating layer B)10)>(relative permittivity of second insulating layer (insulating layer A)20)·{(thickness (T41) of signal line 41)/(distance (S1) between signal line 41 and one conductive line 42a)+(thickness (T41) of signal line 41)/(distance (S2) between signal line 41 and other conductive line 42b)}   Relational Expression 1

Alternatively, the printed wiring board 1 according to the present invention may have a configuration which satisfies the following Relational Expression 2 when the dielectric tangent of the second insulating layer (insulating layer A) 20 is smaller than the dielectric tangent of the first insulating layer (insulating layer B) 10.

(relative permittivity of first insulating layer (insulating layer B) 10)·(width (W41) of signal line 41)/(thickness (T10) of first insulating layer (insulating layer B) 10)<(relative permittivity of second insulating layer (insulating layer A) 20)·{(thickness (T41) of signal line 41)/(distance (S1) between signal line 41 and one conductive line 42a)+(thickness (T41) of signal line 41)/(distance (S2) between signal line 41 and other conductive line 42b)}   Relational Expression 2

In general, losses for signal transmission include a conductive loss and a dielectric loss. The conductive loss is caused by a resistance due to direct current resistance and skin effect, while the dielectric loss is caused by a resistance due to thermal vibration of constituent molecules of the dielectric material. The loss in the printed wiring board 1 according to the present embodiment is primarily due to the dielectric loss, and it is thus proposed to improve the dielectric tangent of a material from the viewpoint of reducing the signal loss.

For a common capacitor, the dielectric tangent is the ratio of a loss current Ir and a current Ic that flows through an ideal capacitance, and may be represented by Equation 1: tan δ(delta)=Ir/Ic (δ is loss angle). An ideal capacitor involves a parasitic resistance in parallel. The parasitic resistance is associated with the resistances of electrodes of the capacitor, leakage current between the electrodes, and the resistance due to thermal vibration of the dielectric material, and the current flowing through this parasitic resistance is the loss current Ir. Assuming that the applied voltage is E for Equation 1, |Ic|=EωC is obtained because Ic is the current flowing through the ideal capacitor, while |Ir|=E/Rp is also obtained because Ir is the current flowing through the parasitic resistance (Rp). The dielectric tangent tan δ is a value determined depending on the material, and therefore, if the same material is used, then tan δ is substantially invariable. As such, the invariable tan δ ensures the ratio of Ir and Ic to be constant.

Considering the above, it will be said that the fraction of ωC and 1/Rp is constant because of tan δ(delta)=Ir/Ic=1/ωCRp. That is, as C increases, Rp decreases, whereas as C decreases, Rp increases.

Here, the above consideration will be applied to the printed wiring board 1 according to the present embodiment. The signal line 41 of the printed wiring board 1 according to the present embodiment has an inductive component and a capacitive component to the ground layer 30, and the fraction thereof defines the characteristic impedance. In addition, the signal line 41 of the printed wiring board 1 according to the present embodiment also has additional capacitive components with the juxtaposed conductive lines 42a and 42b along the extending direction (Y-direction in FIG. 1). That is, the signal line 41 has a total capacitive component with the ground layer 30 facing via the first insulating layer 10 as well as with the conductive line 42a facing via the protecting layer 20 and with the conductive line 42b also facing via the protecting layer 20.

Each electrostatic capacitance C as described above can be obtained by C=∈₀·∈S/d (where, ∈₀ is the permittivity in vacuum, ∈ is the relative permittivity, ·S is the area of the conductors, and d is the distance between the conductors). When obtaining the electrostatic capacitance C between the signal line 41 and the conductive lines 42a and 42b, the area S may be approximated to be the product of (the thicknesses of the signal line 41 and the conductive lines 42a and 42b) and one (1) in terms of the unit length. Similarly, for the electrostatic capacitance C between the signal line 41 and the ground layer 30, the area S may be approximated to be the product of (the width of the signal line 41) and one (1) in terms of the unit length.

C1 (between signal line 41 and conductive line 42a)= (permittivity in vacuum)·(relative permittivity of insulating layer A)·(thickness of signal line 41)/(distance (S1) from one conductive line 42a)

C2 (between signal line 41 and conductive line 42b)= (permittivity in vacuum)·(relative permittivity of insulating layer A)·(thickness of signal line 41)/(distance (S2) from other conductive line 42b)

C3 (between signal line 41 and ground layer 30)= (permittivity in vacuum)·(relative permittivity of insulating layer B)·(width (W41) of signal line 41)/(thickness (T10) of insulating layer B)

The electrostatic capacitances surrounding the signal line 41 may be known from the above C1 to C3.

As previously discussed, since the fraction of ωC and 1/Rp is constant for given capacitors, if respective dielectric tangents and electrostatic capacitances are known, then the ratio of the Rps are also known, and therefore, it may be contemplated to design the printed wiring board 1 such that the loss becomes reduced. In order to reduce the loss, Ir may be decreased, that is, Rp is required to be increased. One way to increase Rp is to reduce C.

However, the electrostatic capacitance C may not be widely changed because the characteristic impedance is required to be adjusted when transmitting signals of high-speed. The printed wiring board 1 according to the present embodiment is provided as the above structure in which the electrostatic capacitance C may be selectively changed under the restriction that the characteristic impedance is to be adjusted.

The transmission characteristics of the printed wiring board 1 will be verified hereinafter in association with the structure according to the present embodiment.

In both cases that the dielectric tangent A is larger than the dielectric tangent B and that the dielectric tangent A is smaller than the dielectric tangent B, the loss (S12) of the printed wiring board 1 is obtained through varying respective width (W41) of the signal line 41 thereby to vary the relationship between "(relative permittivity of insulating layer B (hereinafter also referred to as relative permittivity B))·(width (W41) of signal line 41)/(thickness (T10) of insulating layer B (10))" and "(relative permittivity of insulating layer A (hereinafter also referred to as relative permittivity A))·{(thickness (T41) of signal line 41)/(distance (S1) between signal line 41 and one conductive line 42a)+(thickness (T41) of signal line 41)/(distance (S2) between signal line 41 and other conductive line 42b)}". In the present embodiment, permittivities or dielectric losses of materials are measured by the cavity resonator method on the basis of variation amounts in resonance frequency and/or Q-value within the resonator caused when a small dielectric or magnetic material is inserted into the resonator. In the present embodiment, the loss (S12) of the printed wiring board 1 may be obtained using a commercially available cavity resonator method permittivity measurement apparatus.

First, when the dielectric tangent A was larger than the dielectric tangent B, as shown in Table 1, the distance (S1) between signal line 41 and one conductive line 42a and the distance (S2) between signal line 41 and the other conductive line 42b were varied for Samples 1 to 4 thereby to change the magnitude of the relation in the above relationship. Samples 1 to 4 correspond to the cases of T=0.5, 1, 2 and 4, respectively in FIG. 3.

TABLE 1

Dielectric tangent A > Dielectric tangent B

|  | T | Signal line width (W41) | Thickness of insulating layer A (T20) | Thickness of insulating layer B (T10) | Thickness of conductive layer (T40) | Thickness of ground layer (T30) | Distance from one conductive line (S1) | Distance from other conductive line (S2) | Permittivity A | Permittivity B | Dielectric tangent A | Dielectric tangent B |
|---|---|---|---|---|---|---|---|---|---|---|---|---|
| Sample 1 | 0.5 | 100 | 50 | 100 | 25 | 25 | 25 | 25 | 3 | 3 | 0.05 | 0.005 |
| Sample 2 | 1 | 100 | 50 | 100 | 25 | 25 | 50 | 50 | 3 | 3 | 0.05 | 0.005 |
| Sample 3 | 2 | 100 | 50 | 100 | 25 | 25 | 100 | 100 | 3 | 3 | 0.05 | 0.005 |
| Sample 4 | 4 | 100 | 50 | 100 | 25 | 25 | 200 | 200 | 3 | 3 | 0.05 | 0.005 |

Then, T was defined as being a value obtained by dividing "(relative permittivity B)·(width (W41) of signal line 41)/(thickness (T10) of insulating layer B (10))" by "(relative permittivity A)·{(thickness (T41) of signal line 41)/(distance (S1) between signal line 41 and one conductive line 42a)+(thickness (T41) of signal line 41)/(distance (S2) between signal line 41 and other conductive line 42b)}", and the losses (S12) were measured as transmission characteristics for every T value. In the present examples, S12 parameters were measured with 0.02 GHz-spacing across the frequency range for measurement (0 to 20 GHz), using a network analyzer (N5230 A type) available from Agilent Technologies, Inc. S12 represents a signal (friction) input from port 2 and then transmitted to port 2. Note that, although the relative permittivity A and the relative permittivity B were set as being the same value in view of not making experiments be complex, different values would also lead to similar results.

Figure 3:
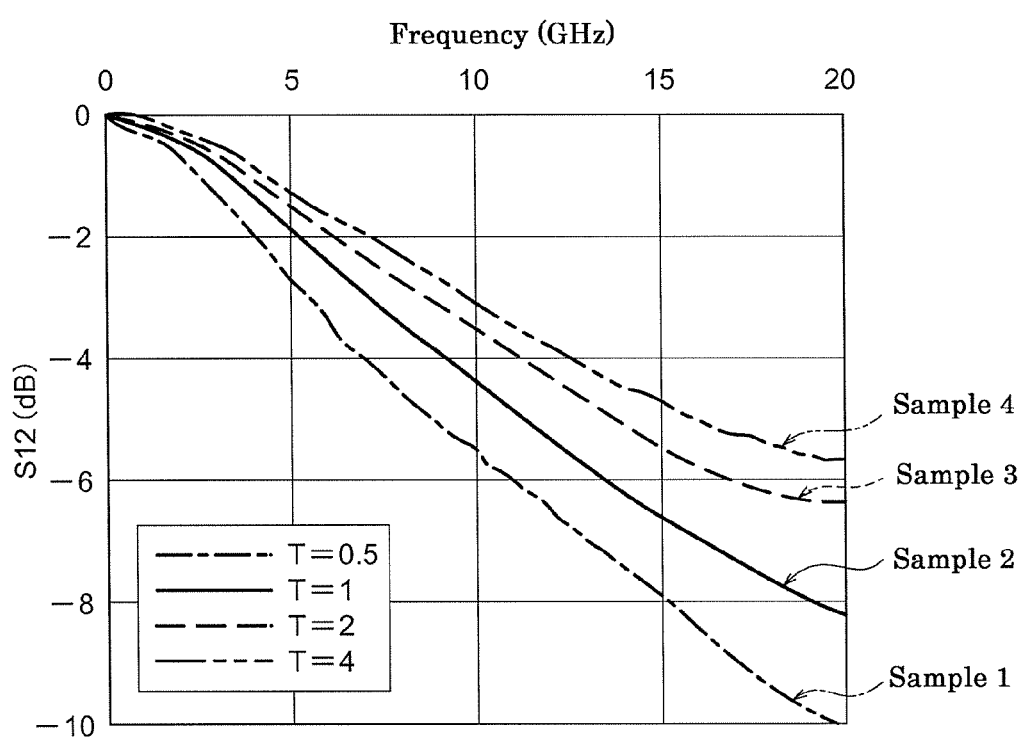
FIG. 3 is a graph showing the transmission characteristics when the dielectric tangent A is larger than the dielectric tangent B.

FIG. 3 shows the losses (S12) in dB of the printed wiring board 1, i.e. Samples 1 to 4, depending on the frequency (GHz). As shown in FIG. 3, when T is one or larger, the losses are low and the transmission characteristics are thus excellent. That is, if the dielectric tangent A is larger than the dielectric tangent B, then the losses are low and the transmission characteristics are excellent when "(relative permittivity B)·(width (W41) of signal line 41)/(thickness (T10) of insulating layer B (10))">"(relative permittivity A)·{(thickness (T41) of signal line 41)/(distance (S1) between signal line 41 and one conductive line 42a)+(thickness (T41) of signal line 41)/(distance (S2) between signal line 41 and other conductive line 42b)}".

In particular, as the difference between the left-hand side and the right-hand side of the above inequality expression becomes large (as T becomes larger than one), that is, if the dielectric tangent A is larger than the dielectric tangent B, then, as "(relative permittivity B)·(width (W41) of signal line 41)/(thickness (T10) of insulating layer B (10))" becomes larger than the value of "(relative permittivity A)·{(thickness (T41) of signal line 41)/(distance (S1) between signal line 41 and one conductive line 42a)+(thickness (T41) of signal line 41)/(distance (S2) between signal line 41 and other conductive line 42b)}", the losses are lower and the transmission characteristics are more excellent.

Subsequently, when the dielectric tangent A was smaller than the dielectric tangent B, as shown in Table 2, the distance (S1) between signal line 41 and one conductive line 42a and the distance (S2) between signal line 41 and the other conductive line 42b were varied for Samples 5 to 8 thereby to change the magnitude of the relation in the above relationship. Samples 5 to 8 correspond to the cases of T=0.5, 1, 2 and 4, respectively in FIG. 4.

TABLE 2

Dielectric tangent A < Dielectric tangent B

|  | T | Signal line width (W41) | Thickness of insulating layer A (T20) | Thickness of insulating layer B (T10) | Thickness of conductive layer (T40) | Thickness of ground layer (T30) | Distance from one conductive line (S1) | Distance from other conductive line (S2) | Permittivity A | Permittivity B | Dielectric tangent A | Dielectric tangent B |
|---|---|---|---|---|---|---|---|---|---|---|---|---|
| Sample 5 | 0.5 | 100 | 50 | 100 | 25 | 25 | 25 | 25 | 3 | 3 | 0.005 | 0.05 |
| Sample 6 | 1 | 100 | 50 | 100 | 25 | 25 | 50 | 50 | 3 | 3 | 0.005 | 0.05 |
| Sample 7 | 2 | 100 | 50 | 100 | 25 | 25 | 100 | 100 | 3 | 3 | 0.005 | 0.05 |
| Sample 8 | 4 | 100 | 50 | 100 | 25 | 25 | 200 | 200 | 3 | 3 | 0.005 | 0.05 |

Figure 4:
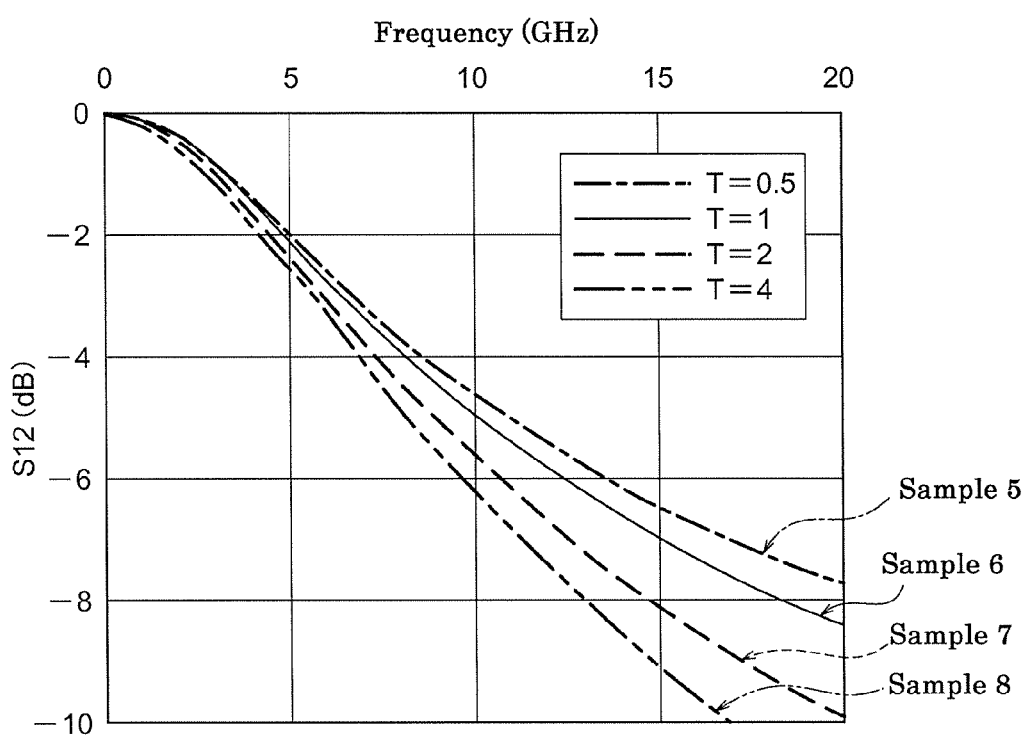
FIG. 4 is a graph showing the transmission characteristics when the dielectric tangent A is smaller than the dielectric tangent B.

Then, the losses (S12) in dB were similarly measured as transmission characteristics for every T value. FIG. 4 shows the losses (S12) in dB of the printed wiring board 1, i.e. Samples 5 to 8, depending on the frequency (GHz). As shown in FIG. 4, when T is one or smaller, the losses are low and the transmission characteristics are thus excellent. That is, if the dielectric tangent A is smaller than the dielectric tangent B, then the losses are low and the transmission characteristics are excellent when "(relative permittivity B)·(width (W41) of signal line 41)/(thickness (T10) of insulating layer B (10))"<" (relative permittivity A)·{(thickness (T41) of signal line 41)/(distance (S1) between signal line 41 and one conductive line 42a)+(thickness (T41) of signal line 41)/(distance (S2) between signal line 41 and other conductive line 42b)}".

In particular, as the difference between the left-hand side and the right-hand side of the above inequality expression becomes large (as T becomes larger than one), that is, if the dielectric tangent A is smaller than the dielectric tangent B, then, as "(relative permittivity B)·(width (W41) of signal line 41)/(thickness (T10) of insulating layer B (10))" becomes smaller than the value of "(relative permittivity A)·{(thickness (T41) of signal line 41)/(distance (S1) between signal line 41 and one conductive line 42a)+(thickness (T41) of signal line 41)/(distance (S2) between signal line 41 and other conductive line 42b)}", the losses are lower and the transmission characteristics are more excellent.

Figure 5:
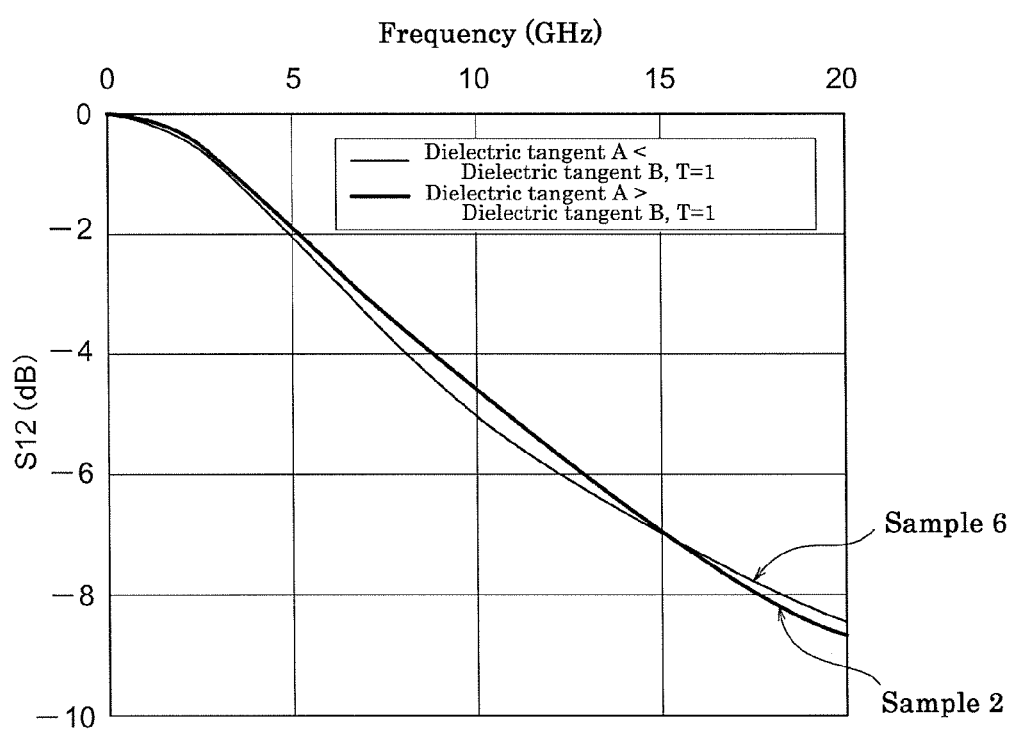
FIG. 5 is a graph comparing the transmission characteristics when the dielectric tangent A is larger than the dielectric tangent B and the transmission characteristics when the dielectric tangent A is smaller than the dielectric tangent B.

Moreover, FIG. 5 shows the comparison between the graph of T=1 (Sample 2) shown in FIG. 3 when the dielectric tangent A is larger than the dielectric tangent B and the graph of T=1 (Sample 6) shown in FIG. 4 when the dielectric tangent A is smaller than the dielectric tangent B. Vertical and horizontal axes in FIG. 5 are the same as those in FIGS. 3 and 4. As shown in FIG. 5, in both cases that the dielectric tangent A is larger than the dielectric tangent B and that the dielectric tangent A is smaller than the dielectric tangent B, the graphs are substantially identical in the cases where "(relative permittivity B)·(width (W41) of signal line 41)/(thickness (T10) of insulating layer B (10))" and "(relative permittivity A)·{(thickness (T41) of signal line 41)/(distance (S1) between signal line 41 and one conductive line 42a)+(thickness (T41) of signal line 41)/(distance (S2) between signal line 41 and other conductive line 42b)}" are the same (i.e. T=1), and therefore, it will be appropriate to obtain a structure of the printed wiring board 1 with lower loss on the basis of the magnitude of the relationship in the above expression.

Examples

Hereinafter, losses (S12) of Examples 1 to 6 where the dielectric tangent A is larger than the dielectric tangent B and Examples 7 and 8 where the dielectric tangent A is smaller than the dielectric tangent B will be described.

First, examples will be explained where the dielectric tangent A is larger than the dielectric tangent B. According to these examples, the width (W41) of the signal line 41 and the distances (S1 and S2) between the signal line 41 and the conductive lines 42a and 42b are obtained as design factors. In these examples, the distance (S1) between the signal line 41 and the conductive line 42a and the distance (S2) between the signal line 41 and the conductive line 42b were assumed to be the same value in order to avoid the experiment from being complex.

Examples 1 to 6 and Reference Examples 1 and 2 for the printed wiring board 1 were configured using materials shown in Table 3 below.

TABLE 3

Dielectric tangent A > Dielectric tangent B

| Material | | Thickness | Relative permittivity | Dielectric tangent |
|---|---|---|---|---|
| Insulating base material 11 | Polyimide | 50 | 3.3 | 0.004 |
| First adhesive layer 12, Second adhesive layer 13 | Epoxy-base adhesive | 10 | 3.9 | 0.02 |
| Protecting layer 20 | Epoxy-base adhesive | 50 | 4.6 | 0.04 |
| Thickness (T41) of signal line | Copper foil + Copper plating | 33 | — | — |
| Thickness (T42) of conductive lines | Copper foil + Copper plating | 33 | — | — |

According to the present examples and reference examples, the relative permittivity B was obtained as follows because the insulating layer B was made as multi layer structure. Assuming that the electrostatic capacitance C of the insulating layer B is represented as $C=\epsilon_0 \cdot \epsilon \cdot S/d$, then $\epsilon = C \cdot d / \epsilon_0 \cdot S$ is obtained. On the other hand, the electrostatic capacitance C of the insulating layer B is to be 1/C=1/(electrostatic capacitance of insulating base material 11)+1/(electrostatic capacitance of first adhesive layer 12)+1/(electrostatic capacitance of second adhesive layer 13). Using the values shown in Table 3, the relative permittivity B is obtained as $3.3 \cdot 3.9 \cdot (50+10\cdot 2)/(50\cdot 3.9+(10+10)\cdot 3.3) \approx 3.45$.

Thereafter, the product of the width (W41) of the signal line 41 and the distance (S1, S2) between the signal line 41 and the conductive lines 42a, 42b as the design factors is obtained from the relationship between "(relative permittivity B)·(width (W41) of signal line 41)/(thickness (T10) of insulating layer B (10))" and "(relative permittivity A)·{(thickness (T41) of signal line 41)/(distance (S1) between signal line 41 and one conductive line 42a)+(thickness (T41) of signal line 41)/(distance (S2) between signal line 41 and other conductive line 42b)}".

Substituting the previously obtained relative permittivity B and the values of Table 3 into the above relationship, "3.45·(width (W41) of signal line 41)/70>4.6·33·2/(distance (S1, S2) between signal lime 41 and conductive lines 42a, 42b)" is obtained, resulting in "(width (W41) of signal line 41)·(distance (S1, S2) between signal lime 41 and conductive lines 42a, 42b)>4.6·33·2·70/3.45=6160".

In simple terms, it may be required to obtain a structure where the value of "(width (W41) of signal line 41)·(distance (S1, S2) between signal lime 41 and conductive lines 42a, 42b)" comes to be larger than 6160. The structure of each printed wiring board 1 for Examples 1 to 6 and Reference Examples 1 and 2 is shown in Table 4 below. As shown in Table 4, each printed wiring board 1 for Examples 1 to 6 satisfies that (width (W41) of signal line 41)·(distance (S1, S2) between signal lime 41 and conductive lines 42a, 42b) is larger than 6160. Whereas, Reference Examples 1 and 2 fail to satisfy that (width (W41) of signal line 41)·(distance (S1, S2) between signal lime 41 and conductive lines 42a, 42b) is larger than 6160. Note that the impedance is supposed to be a constant value (e.g. 50) in Examples according to the present embodiment and Reference Examples.

TABLE 4

|  | Example 1 | Example 2 | Example 3 | Example 4 | Example 5 | Example 6 | Ref. Example 1 | Ref. Example 2 |
|---|---|---|---|---|---|---|---|---|
| Width of signal line (W41) | 140 | 130 | 125 | 115 | 100 | 90 | 85 | 60 |
| Distance between signal line and conductive lines (S1, S2) | 200 | 150 | 125 | 100 | 80 | 70 | 65 | 50 |
| (width of signal line) · (distance) (W4*S1, S2) | 28000 | 19500 | 15625 | 11500 | 8000 | 6300 | 5525 | 3000 |
| Impedance | 50 | 50 | 50 | 50 | 50 | 50 | 50 | 50 |

Figure 6:
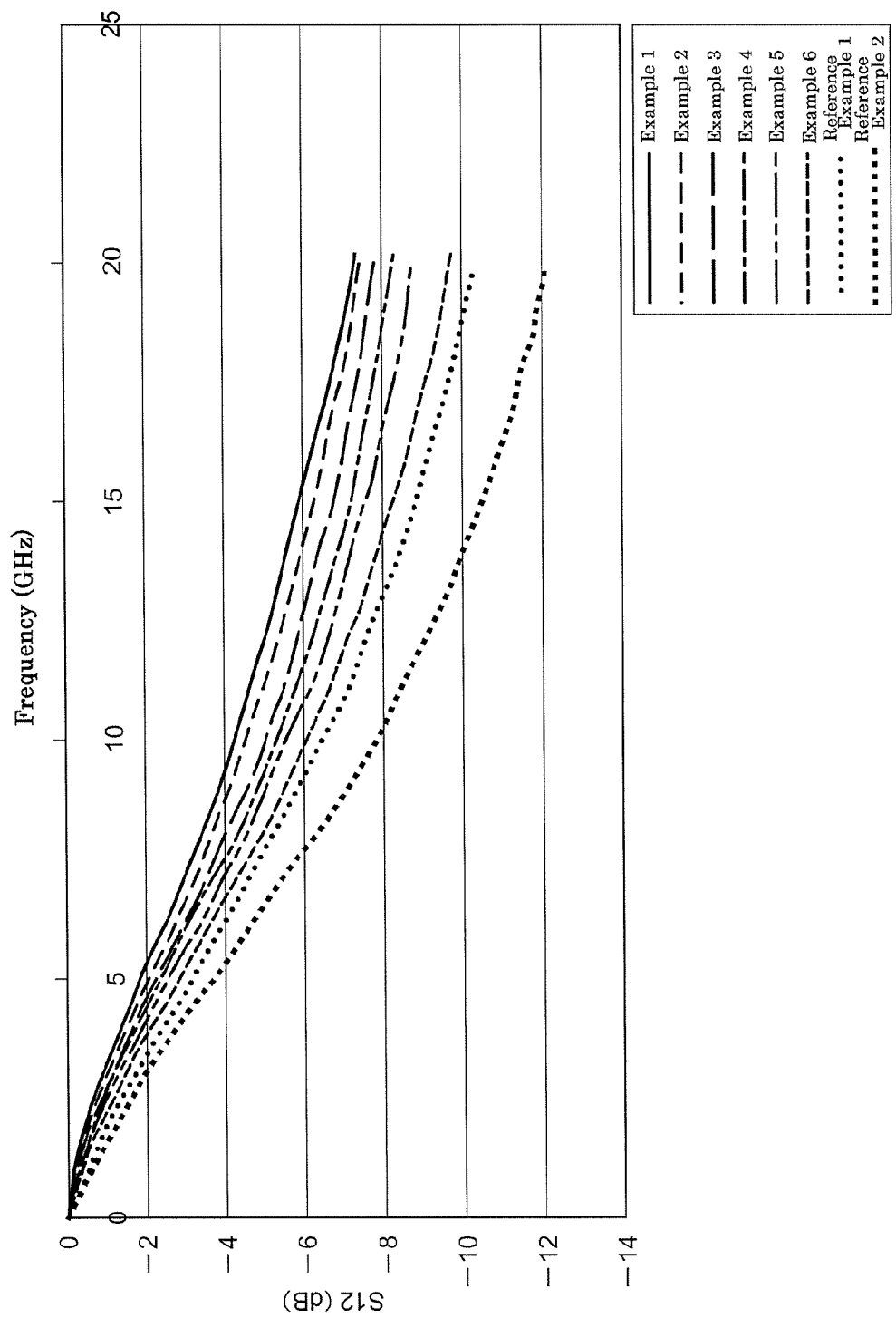
FIG. 6 is a graph showing the transmission characteristics of examples when the dielectric tangent A is larger than the dielectric tangent B.

Subsequently, losses (S12) in dB of Examples 1 to 6 and Reference Examples 1 and 2 were measured. FIG. 6 shows the losses (S12) in dB of these examples depending on the frequency (GHz). As shown in FIG. 6, Examples 1 to 6, which satisfy the above relationship, exhibit low losses and excellent transmission characteristics. However, it has become clear that Reference Examples 1 and 2, which fail to satisfy the above relationship, exhibit relatively high losses and relatively poor transmission characteristics.

Examples will then be explained where the dielectric tangent A is smaller than the dielectric tangent B. According to these examples, the width (W41) of the signal line 41 and the distances (S1, S2) between the signal line 41 and the conductive lines 42a and 42b are also obtained as design factors. Likewise the previously described examples, the distance (S1) between the signal line 41 and the conductive line 42a and the distance (S2) between the signal line 41 and the conductive line 42b were assumed to be the same value.

Examples 7 and 8 and Reference Examples 3 to 7 for the printed wiring board 1 were configured using materials shown in Table 5 below.

TABLE 5

Dielectric tangent A < Dielectric tangent B

| Material | | Thickness | Relative permittivity | Dielectric tangent |
|---|---|---|---|---|
| Insulating base material 11 | Polyimide | 25 | 3.3 | 0.008 |
| First adhesive layer 12, Second adhesive layer 13 | Epoxy-base adhesive | 10 | 3.9 | 0.02 |
| Protecting layer 20 | Epoxy-base adhesive | 50 | 2.9 | 0.0005 |
| Thickness (T41) of signal line | Copper foil + Copper plating | 33 | — | — |
| Thickness (T42) of conductive lines | Copper foil + Copper plating | 33 | — | — |

Likewise Examples 1 to 6 and Reference Examples 1 and 2, the relative permittivity B of the multi layer structure insulating layer B of the printed wiring board 1 for each of Examples 7 and 9 and Reference Examples 3 to 7 is obtained using the values shown in Table 5 as 3.3·3.9·(25+10·2)/(25·3.9+(10+10)·3.3)≈3.54.

Thereafter, the product of the width (W41) of the signal line 41 and the distance (S1, S2) between the signal line 41 and the conductive lines 42a, 42b as the design factors is obtained.

Substituting the previously obtained relative permittivity B and the values of Table 5 into the above relationship, "3.54·(signal line width)/45<2.9·33·2/(distance (S1, S2) between signal lime 41 and conductive lines 42a, 42b)" is obtained, resulting in (width (W41) of signal line 41)·(distance (S1, S2) between signal lime 41 and conductive lines 42a, 42b) <2.9·33·2·45/3.54=2433.

In simple terms, it may be required to obtain a structure where the value of (width (W41) of signal line 41)·(distance (S1, S2) between signal lime 41 and conductive lines 42a, 42b) comes to be smaller than 2433. The structure of each printed wiring board 1 for Examples 7 and 8 and Reference Examples 3 to 7 is shown in Table 6 below. As shown in Table 6, each printed wiring board 1 for Examples 7 and 8 satisfies that (width (W41) of signal line 41)·(distance (S1, S2) between signal lime 41 and conductive lines 42a, 42b) is smaller than 2433. Whereas, Reference Examples 3 to 7 fail to satisfy that (width (W41) of signal line 41)·(distance (S1, S2) between signal lime 41 and conductive lines 42a, 42b) is smaller than 2433. Note that the impedance is supposed to be a constant value (e.g. 50) in Examples according to the present embodiment and Reference Examples.

TABLE 6

|  | Example 7 | Example 8 | Ref. Example 3 | Ref. Example 4 | Ref. Example 5 | Ref. Example 6 | Ref. Example 7 |
|---|---|---|---|---|---|---|---|
| Width of signal line (W41) | 25 | 45 | 60 | 70 | 80 | 85 | 90 |
| Distance between signal line and conductive lines (S1, S2) | 30 | 40 | 50 | 65 | 80 | 100 | 150 |
| (width of signal line) · (distance) (W4*S1, S2) | 750 | 1800 | 3000 | 4550 | 6400 | 8500 | 13500 |
| Impedance | 50 | 50 | 50 | 50 | 50 | 50 | 50 |

Figure 7:
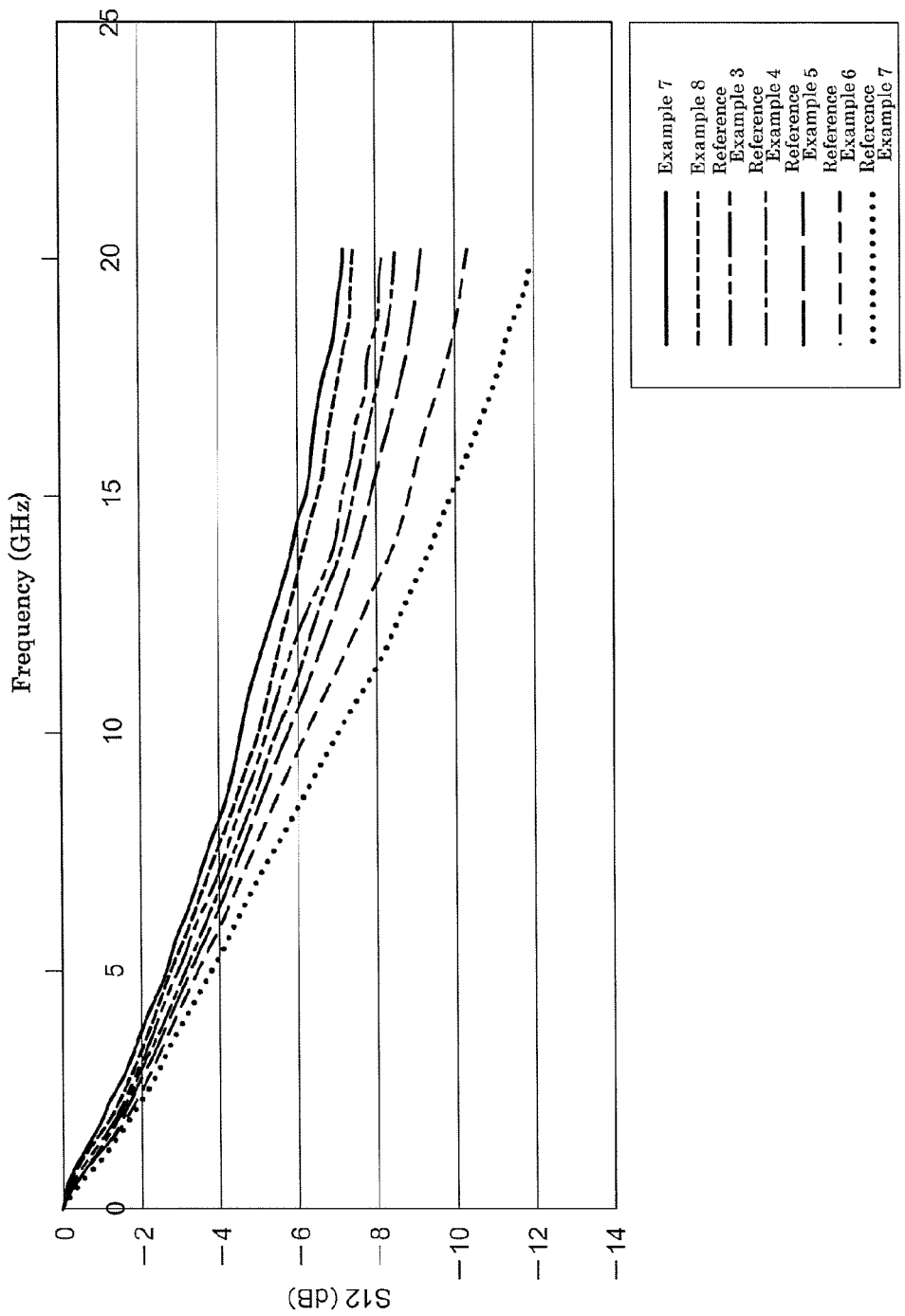
FIG. 7 is a graph showing the transmission characteristics of examples when the dielectric tangent A is smaller than the dielectric tangent B.

Subsequently, losses (S12) in dB of Examples 7 and 8 and Reference Examples 3 to 7 were measured. FIG. 7 shows the losses (S12) in dB of these examples depending on the frequency (GHz). As shown in FIG. 7, Examples 7 and 8, which satisfy the above relationship, exhibit low losses and excellent transmission characteristics. However, it has become clear that Reference Examples 3 to 7, which fail to satisfy the above relationship, exhibit relatively high losses and relatively poor transmission characteristics.

As described hereinbefore, the printed wiring board 1 according to the embodiment of the present invention is allowed to adjust each of the electrostatic capacitances C1 to C3 of the insulating layers on the basis of the relationship among the material characteristics of the insulating layers A and B, the width (W41) of the signal line and the thicknesses (T20 and T10) of the insulating layers, depending on the magnitude relationship of the dielectric tangent between the insulating layers A and B facing each other. Consequently, the printed wiring board 1 can be provided as a structure which is excellent in transmission characteristics thereby to allow for high-speed transmission, while being readily to be designed.

Second Embodiment

A printed wiring board 1 according to the second embodiment will then be described. The printed wiring board 1 according to the second embodiment has differential transmission lines and thus comprises a so-called differential microstrip line structure.

Figure 8:
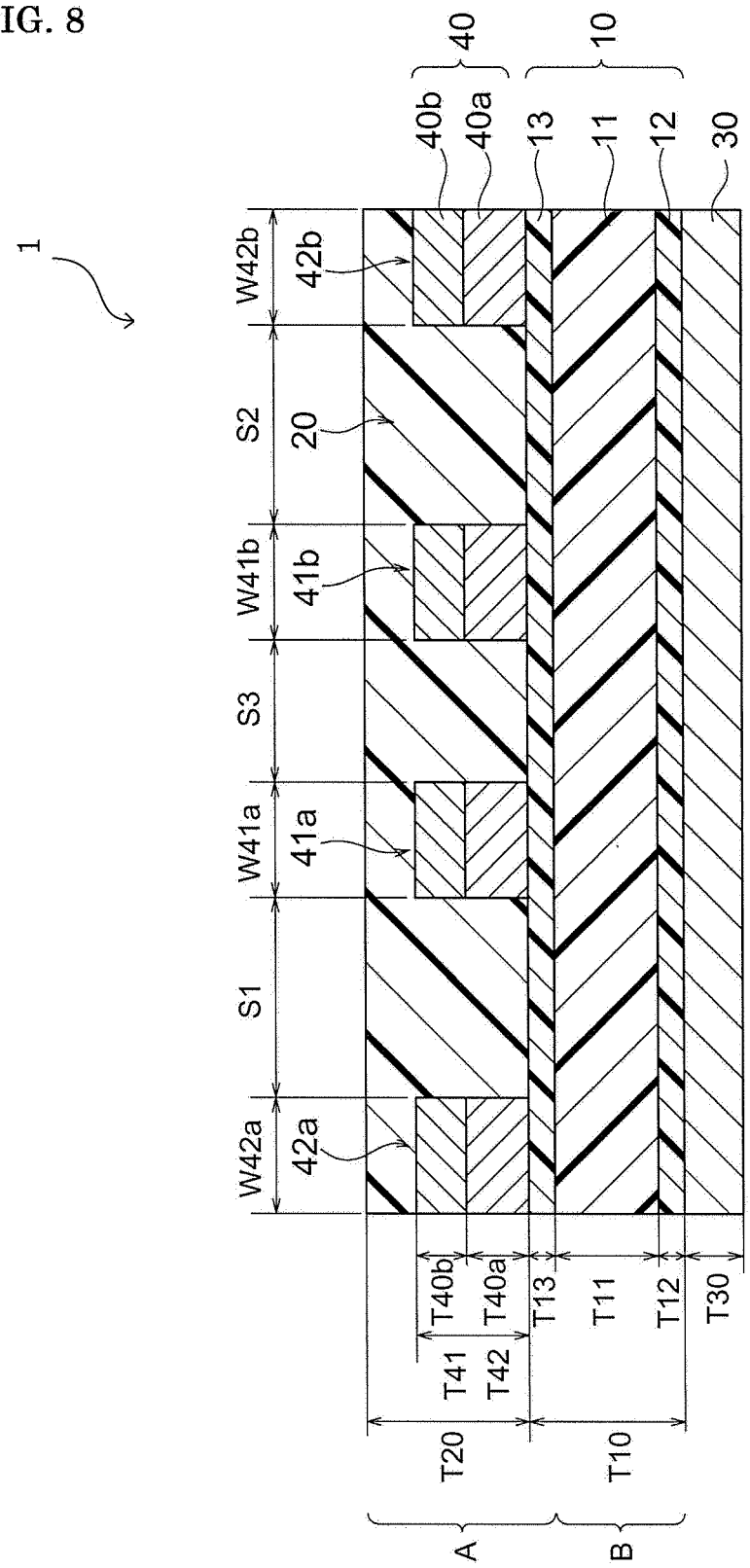
FIG. 8 is an enlarged cross-sectional view, which corresponds to FIG. 2, of a printed wiring board according to the second embodiment.

FIG. 8 is an enlarged cross-sectional view, which corresponds to FIG. 2, of the printed wiring board 1 according to the second embodiment. The same reference numerals or characters in FIG. 8 denote the same or similar components or parameters in FIG. 2. As shown in FIG. 8, the printed wiring board 1 according to the present embodiment has a pair of signal lines 41a and 41b, and two conductive lines 42a and 42b are juxtaposed at both sides of the pair of signal lines 41a and 41b. Reversed voltages are applied to the signal lines 41a and 41b, which are thus associated with approximately a doubling of voltage potential difference to the ground layer 30. This may possibly cause the electric field variation to increase during signal transmission thereby increasing the loss. In the present embodiment, the electrostatic capacitance between the pair of signal lines 41a and 41b is considered to be doubled compared to the case where a single signal line is used, and therefore, the printed wiring board 1 according to the present embodiment, which has the differential microstrip line structure, may be applied to the first embodiment.

That is, the printed wiring board 1 as shown in FIG. 8 has a configuration which satisfies the following Relational Expression 1 when the dielectric tangent A of the second insulating layer (insulating layer A) 20 is larger than the dielectric tangent B of the first insulating layer (insulating layer B) 10.

(relative permittivity $B$)·(width ($W41$) of signal lines $41$)/(thickness ($T10$) of first insulating layer (insulating layer $B$)$10$)>(relative permittivity $A$)·{(thickness ($T41$) of signal lines $41$)/(distance ($S1$) between signal lines $41$ and one conductive line $42a$)+(thickness ($T41$) of signal lines $41$)/(distance ($S2$) between signal lines $41$ and other conductive line $42b$)+(thickness ($T41$) of signal lines $41$)/(distance ($S3$) between pair of signal lines ($41a$ and $41b$))·2}     Relational Expression 1

Alternatively, the printed wiring board 1 as shown in FIG. 8 has a configuration which satisfies the following Relational Expression 2 when the dielectric tangent A of the second insulating layer (insulating layer A) 20 is smaller than the dielectric tangent B of the first insulating layer (insulating layer B) 10.

(relative permittivity $B$)·(width ($W41$) of signal lines $41$)/(thickness ($T10$) of first insulating layer (insulating layer $B$)$10$)<(relative permittivity $A$)·{(thickness ($T41$) of signal lines $41$)/(distance ($S1$) between signal lines $41$ and one conductive line $42a$)+(thickness ($T41$) of signal lines $41$)/(distance ($S2$) between signal lines $41$ and other conductive line $42b$)+(thickness ($T41$) of signal lines $41$)/(distance ($S3$) between pair of signal lines ($41a$ and $41b$))·2}     Relational Expression 2

The present embodiment performs in a similar manner as the first embodiment, and thus provides the printed wiring board 1 which has a structure excellent in transmission characteristics thereby to allow for high-speed transmission while being readily to be designed.

Third Embodiment

A printed wiring board 1 according to the third embodiment will then be described. The printed wiring board 1 according to the third embodiment is characterized by making the ground layer 30 as a mesh structure in view of matching the characteristic impedance. Other points have much in common with the first embodiment and the second embodiment, so the different points will be primarily described.

Figure 9:
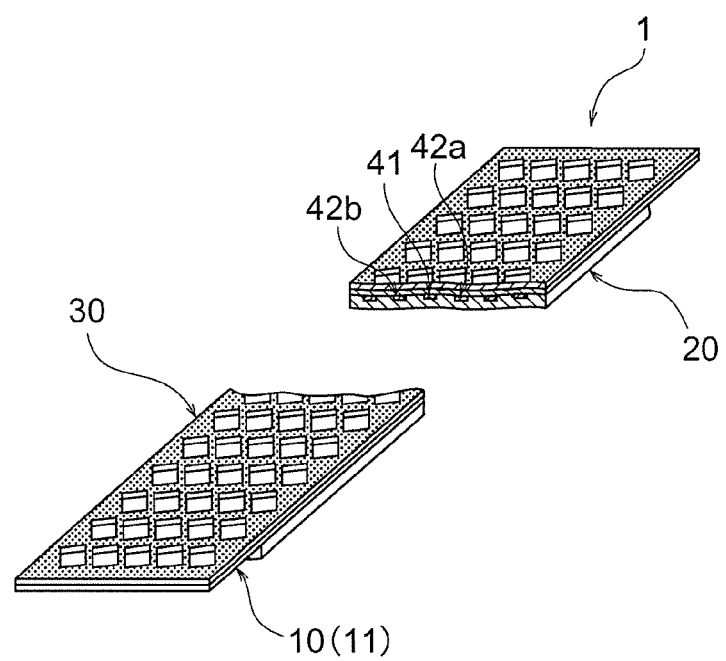
FIG. 9 is a rear surface perspective view of a printed wiring board according to the third embodiment of the present invention.

FIG. 9 is a perspective view that is viewed from the rear surface of printed wiring board 1 as shown in FIG. 1. Therefore, the first insulating layer 10 including the insulating base material 11 is shown in the upper side than the protecting layer (second insulating layer) 20. As shown in FIG. 9, the ground layer 30 has a mesh structure configured such that a plurality of regions are discretely removed to leave a remaining region. Dotted area in the figure represents the remaining region, while non-dotted areas within the ground layer 30 are the removed regions. Thus, by making the ground layer 30 as the mesh structure, the fraction of metal region in the ground layer 30 may be adjusted to obtain a desired value of the characteristic impedance.

The printed wiring board 1 according to the present embodiment is modified with respect to Relational Expression 1 and Relational Expression 2 in the first and second embodiments, so that the value of "(relative permittivity B of first insulating layer 10)·(width W41 of signal line 41)/(thickness (T10) of first insulating layer 10)" is multiplied by a conductive region ratio representing the ratio of an area of the remaining region to an area of the entire region where the ground layer 30 is provided, thereby being calculated as "(relative permittivity B of first insulating layer 10)·(width W41 of signal line 41)/(thickness (T10) of first insulating layer 10)·(conductive region ratio)".

That is, the printed wiring board 1 as shown in FIG. 9 has a configuration which satisfies the following Relational Expression 1 when the dielectric tangent A of the second insulating layer (insulating layer A) 20 is larger than the dielectric tangent B of the first insulating layer (insulating layer B) 10.

(relative permittivity $B$)·(width ($W41$) of signal line $41$)/(thickness ($T10$) of first insulating layer (insulating layer $B$)$10$)·(conductive region ratio)>(relative permittivity $A$)·{(thickness ($T41$) of signal line $41$)/(distance ($S1$) between signal line $41$ and one conductive line $42a$)+(thickness ($T41$) of signal line $41$)/(distance ($S2$) between signal line $41$ and other conductive line $42b$)}     Relational Expression 1

Alternatively, the printed wiring board 1 as shown in FIG. 9 has a configuration which satisfies the following Relational Expression 2 when the dielectric tangent A of the second insulating layer (insulating layer A) 20 is smaller than the dielectric tangent B of the first insulating layer (insulating layer B) 10.

$$\begin{aligned}&(\text{relative permittivity } B)\cdot(\text{width }(W41)\text{ of signal line}\\&\quad 41)/(\text{thickness }(T10)\text{ of first insulating layer (insulating layer }B)10)\cdot(\text{conductive region ratio})<\\&(\text{relative permittivity }A)\cdot\{(\text{thickness }(T41)\text{ of signal line }41)/(\text{distance }(S1)\text{ between signal line }41\\&\quad\text{and one conductive line }42a)+(\text{thickness }(T41)\text{ of}\\&\quad\text{signal line }41)/(\text{distance }(S2)\text{ between signal line}\\&\quad 41\text{ and other conductive line }42b)\}\end{aligned}\quad\text{Relational Expression 2}$$

This may perform in a similar manner as the first and second embodiments even if making the ground layer 30 as the mesh structure in order to match the characteristic impedance, and may thus provide the printed wiring board 1 which has a structure excellent in transmission characteristics thereby to allow for high-speed transmission while being readily to be designed.

It is to be noted that the embodiments as explained above are described to facilitate understanding of the present invention and are not described to limit the present invention. Therefore, it is intended that the elements disclosed in the above embodiments include all design changes and equivalents to fall within the technical scope of the present invention.

DESCRIPTION OF REFERENCE NUMERALS

1 . . . printed wiring board
10 . . . first insulating layer
11 . . . insulating base material
12 . . . first adhesive layer
13 . . . second adhesive layer
20 . . . protecting layer, second insulating layer
40 . . . conductive layer
41, 41a, 41b . . . signal line
42, 42a, 42b . . . ground line, conductive line
40a . . . copper foil layer
40b . . . plated layer
30 . . . ground layer

What is claimed is:

1. A printed wiring board comprising:
a first insulating layer;
a ground layer formed on one main surface of the first insulating layer;
a signal line formed on other main surface of the first insulating layer;
two conductive lines formed on the other main surface of the first insulating layer and juxtaposed to the signal line such that the signal line is interposed between the conductive lines; and
a second insulating layer laminated at a side of the other main surface of the first insulating layer so as to cover the signal line and the conductive lines,
wherein, upon a dielectric tangent of the second insulating layer being larger than a dielectric tangent of the first insulating layer, the printed wiring board is configured to have a relationship as follows: (a relative permittivity of the first insulating layer)·(a width of the signal line)/(a thickness of the first insulating layer)>(a relative permittivity of the second insulating layer)·((a thickness of the signal line)/(a distance between the signal line and one of the conductive lines)+(the thickness of the signal line)/(a distance between the signal line and the other of the conductive lines)).

2. The printed wiring board as set forth in claim 1, wherein the ground layer has a mesh structure configured such that a plurality of regions are discretely removed to leave a remaining region, and
a value of (a relative permittivity of the first insulating layer)·(a width of the signal line)/(a thickness of the first insulating layer) in the relationship is multiplied by a conductive region ratio representing a ratio of an area of the remaining region to an area of an entire region where the ground layer is provided, thereby being calculated as (a relative permittivity of the first insulating layer)·(a width of the signal line)/(a thickness of the first insulating layer)·(the conductive region ratio).

3. A printed wiring board comprising:
a first insulating layer;
a ground layer formed on one main surface of the first insulating layer;
a pair of signal lines formed on other main surface of the first insulating layer;
two conductive lines formed on the other main surface of the first insulating layer and juxtaposed to the pair of signal lines such that the signal lines are interposed between the conductive lines; and
a second insulating layer laminated at a side of the other main surface of the first insulating layer so as to cover the signal lines and the conductive lines,
wherein, upon a dielectric tangent of the second insulating layer being larger than a dielectric tangent of the first insulating layer, the printed wiring board is configured to have a relationship as follows: (a relative permittivity of the first insulating layer)·(a width of the signal lines)/(a thickness of the first insulating layer)>(a relative permittivity of the second insulating layer)·((a thickness of the signal lines)/(a distance between the signal lines and one of the conductive lines)+(the thickness of the signal lines)/(a distance between the signal and the other of the conductive lines)+(the thickness of the signal lines)/(a distance between the pair of signal lines)·2).

4. The printed wiring board as set forth in claim 3, wherein the ground layer has a mesh structure configured such that a plurality of regions are discretely removed to leave a remaining region, and
a value of (a relative permittivity of the first insulating layer)·(a width of the signal lines)/(a thickness of the first insulating layer) in the relationship is multiplied by a conductive region ratio representing a ratio of an area of the remaining region to an area of an entire region where the ground layer is provided, thereby being calculated as (a relative permittivity of the first insulating layer)·(a width of the signal lines)/(a thickness of the first insulating layer)·(the conductive region ratio).

5. A printed wiring board comprising:
a first insulating layer;
a ground layer formed on one main surface of the first insulating layer;
a signal line formed on other main surface of the first insulating layer;
two conductive lines formed on the other main surface of the first insulating layer and juxtaposed to the signal line such that the signal line is interposed between the conductive lines; and
a second insulating layer laminated at a side of the other main surface of the first insulating layer so as to cover the signal line and the conductive lines,
wherein, upon a dielectric tangent of the second insulating layer being smaller than a dielectric tangent of the first insulating layer, the printed wiring board is configured to have a relationship as follows: (a relative permittivity of the first insulating layer)·(a width of the signal line)/(a thickness of the first insulating layer)<(a relative permittivity of the second insulating layer)·((a thickness of the signal line)/(a distance between the signal line and one of the conductive lines)+(the thickness of the signal line)/(a distance between the signal line and the other of the conductive lines)).

6. The printed wiring board as set forth in claim 5, wherein the ground layer has a mesh structure configured such that a plurality of regions are discretely removed to leave a remaining region, and a value of (a relative permittivity of the first insulating layer)·(a width of the signal line)/(a thickness of the first insulating layer) in the relationship is multiplied by a conductive region ratio representing a ratio of an area of the remaining region to an area of an entire region where the ground layer is provided, thereby being calculated as (a relative permittivity of the first insulating layer)·(a width of the signal line)/(a thickness of the first insulating layer)·(the conductive region ratio).

7. A printed wiring board comprising:

a first insulating layer;

a ground layer formed on one main surface of the first insulating layer;

a pair of signal lines formed on other main surface of the first insulating layer;

two conductive lines formed on the other main surface of the first insulating layer and juxtaposed to the pair of signal lines such that the signal lines are interposed between the conductive lines; and a second insulating layer laminated at a side of the other main surface of the first insulating layer so as to cover the signal lines and the conductive lines, wherein, when a dielectric tangent of the second insulating layer is smaller than a dielectric tangent of the first insulating layer, the printed wiring board is configured to have a relationship as follows: (a relative permittivity of the first insulating layer)·(a width of the signal lines)/(a thickness of the first insulating layer)<(a relative permittivity of the second insulating layer)·((a thickness of the signal lines)/(a distance between the signal line and one of the conductive lines)+(the thickness of the signal lines)/(a distance between the signal line and the other of the conductive lines)+(the thickness of the signal lines)/(a distance between the pair of signal lines)·2).

8. The printed wiring board as set forth in claim 7, wherein the ground layer has a mesh structure configured such that a plurality of regions are discretely removed to leave a remaining region, and a value of (a relative permittivity of the first insulating layer)·(a width of the signal lines)/(a thickness of the first insulating layer) in the relationship is multiplied by a conductive region ratio representing a ratio of an area of the remaining region to an area of an entire region where the ground layer is provided, thereby being calculated as (a relative permittivity of the first insulating layer)·(a width of the signal lines)/(a thickness of the first insulating layer)·(the conductive region ratio).

* * * * *